(12) United States Patent
Lee et al.

(10) Patent No.: US 6,621,291 B2
(45) Date of Patent: Sep. 16, 2003

(54) DEVICE AND METHOD FOR ESTIMATING THE RESISTANCE OF A STATOR WINDING FOR AN AC INDUCTION MOTOR

(75) Inventors: Sang-Bin Lee, Schenectady, NY (US); Thomas G. Habetler, Snellville, GA (US); David J. Gritter, Wauwatosa, WI (US)

(73) Assignee: Eaton Corporation, Cleveland, OH (US)

( * ) Notice: Subject to any disclaimer, the term of this patent is extended or adjusted under 35 U.S.C. 154(b) by 42 days.

(21) Appl. No.: 09/929,990

(22) Filed: Aug. 15, 2001

(65) Prior Publication Data

US 2003/0034793 A1 Feb. 20, 2003

(51) Int. Cl.$^7$ .............................................. G01R 31/34
(52) U.S. Cl. ...................................... 324/772; 324/158.1
(58) Field of Search ................................. 324/772, 545, 324/158.1, 119, 177; 318/490; 73/54.35

(56) References Cited

U.S. PATENT DOCUMENTS

| | | | | |
|---|---|---|---|---|
| 4,083,001 A | * | 4/1978 | Paice | 324/772 |
| 4,766,387 A | * | 8/1988 | Browne et al. | 324/545 |
| 4,952,854 A | * | 8/1990 | Periou et al. | 318/257 |
| 5,514,978 A | * | 5/1996 | Koegl et al. | 324/772 |
| 5,861,728 A | * | 1/1999 | Tazawa et al. | 318/778 |

* cited by examiner

Primary Examiner—Kamand Cuneo
Assistant Examiner—Tung X. Nguyen
(74) Attorney, Agent, or Firm—Boyle Fredrickson Newholm Stein & Gratz S.C.

(57) ABSTRACT

A device and method to estimate the resistance of a stator winding of an AC induction motor is provided. The device includes an AC induction circuit connecting one phase of the AC induction motor to an AC source. The circuit includes a resistor and a switch connected in parallel. The switch is alternatively closed during the half cycles of the AC current supplied to the motor so as to inject a DC voltage and current bias to the AC motor. The resistance of the stator winding is estimated in response to the DC voltage and current bias.

23 Claims, 3 Drawing Sheets

T : TIME
$T_s$ : SAMPLING PERIOD
$T_0$ : Dc INJECTION INTERVAL
$T_1$ : Dc INJECTION INTERVAL
$T_2$ : NORMAL OPERATION INTERVAL

DEVICE AND METHOD FOR ESTIMATING THE RESISTANCE OF A STATOR WINDING FOR AN AC INDUCTION MOTOR

FIELD OF THE INVENTION

This invention relates generally to the thermal protection of AC induction motors, and in particular, to a device and method for estimating the resistance of a stator winding of an AC induction motor in order to monitor the temperature of the winding.

BACKGROUND AND SUMMARY OF THE INVENTION

As is known, organic materials used for stator winding insulation in an AC induction motor are subject to deterioration from excessive heat generated in the winding during operation of the motor. While it can be appreciated that the stator winding and the insulation therefore are designed not to deteriorate during normal operation of the motor, there are situations where the temperature of the winding can exceed its maximum limit thereby causing deterioration of the insulation. These situations on the motor include transient overload conditions such as motor stall, jam, and start-up; running overload conditions such as an overloaded motor; and abnormal cooling situations wherein the flow of the cooling air is accidentally obstructed. Insulation failure of the stator winding degrades the performance of the motor and eventually leads to motor failure. Hence, thermal protection of a motor is fundamental to proper operation of the motor.

Typically, stator winding temperature estimation for thermal protection of a motor is based on the thermal heat transfer model of an induction machine. Thermal devices such as bimetallic strips or eutectic melting alloys have been used for protecting the stator windings of induction machines. In addition, software programs, which estimate the internal temperature of the induction machine using estimated power losses and a microprocessor embedded thermal heat transfer model of the induction machine, have become commercially available. These software programs use approximated thermal models and assume that the stator and rotor resistance $R_s$ and $R_r$, respectively, and the thermal parameters are fixed. However, it has been found that use of approximated thermal models may result in unacceptable temperature estimates when a dramatic change in the thermal situation of the induction machine occurs.

Alternatively, a stator resistance estimation technique may be used for the purpose of monitoring the temperature of the stator winding. As is known, resistance is a direct indicator of temperature. Consequently, the temperature of the stator winding of the induction machine can be determined from the resistance thereof. Further, since resistance-based temperature estimation is also capable of detecting the reduced cooling ability of the induction machine, resistance based temperature estimation provides significant advantages over conventional thermal model based methods.

An example of a device and method for estimating the resistance of a stator winding of an induction machine is shown in Paice, U.S. Pat. No 4,083,001. The device includes an asymmetric resistance device taking the form of a circuit having two parallel branches with diodes connected with opposite polarity in the two branches so that the device is conductive in both directions. The asymmetric characteristics are obtained by using different numbers of diodes in the two branches so that the resistances are different. During operation of the AC motor, a small direct current component is introduced. The resistance of the stator winding is then determined from measurements of the direct current component and the corresponding voltage. As heretofore described, since resistance is a function of temperature, the temperature of the stator winding may be monitored.

While functional for its intended purpose, the device and method disclosed in the Paice '001 patent have certain disadvantages. For example, a user has no control over the magnitude of the DC current and voltage supplied to the AC motor. As such, the functionality of the device and method shown in the Paice '001 patent may vary depending on the size and the value of the resistance of the AC motor. Further, the device disclosed in the Paice '001 patent is operatively connected to the AC motor at all times. However, the change in resistance of the stator winding of an AC motor changes slowly over time. Hence, it is unnecessary for a user to constantly measure the resistance of the stator winding. Further, the DC offset generated by the device shown in the Paice '001 patent generates a torque pulsation in the AC motor that is proportional to the DC current and voltage bias injected thereto. As a result, a significant amount of energy may be wasted through the use of the device and method disclosed in the Paice '001 patent.

Therefore, it is a primary object and feature of the present invention to provide a device and method for estimating the resistance of a stator winding of an AC induction motor which is simple and inexpensive to utilize.

It is a further object and feature of the present invention to provide a device and method for estimating the resistance of a stator winding of an AC induction motor which dissipates small amounts of energy during use.

It is a still further object and feature of the present invention to provide a device and method for estimating the resistance of a stator winding of an AC induction motor which injects a DC voltage and current bias to the AC induction motor only during predetermined time periods.

In accordance with the present invention, a device is provided to estimate the resistance of a stator winding of an AC motor. The AC motor has a motor terminal connectable to an AC source for providing voltage and current to the AC motor. The device includes a resistor circuit having a first input node and a second output node. The input node is connectable to the AC source and the output node is connectable to the motor terminal. A switch is connected in parallel with the resistor circuit. The switch is movable between the first open position and a second closed position. A voltmeter is provided for measuring the voltage drop across the resistor and an ammeter is provided for measuring the DC current supplied to the motor terminal. A digital signal processor is operatively connected to the switch, the voltmeter and the ammeter. The digital signal processor controls the movement of the switch between the open and closed positions so as to inject a DC voltage and current bias to the AC motor. In addition, the digital signal processor estimates the resistance of a stator winding in response to the DC voltage and current bias. It is contemplated that the switch be either a MOSFET or an IGBT.

In accordance with a still further aspect of the present invention, a method is provided for estimating the resistance of a stator winding of an AC motor. The AC motor has a motor terminal connectable to an AC source for supplying voltage and current to the AC motor. The method includes the steps of connecting a resistor circuit and a switch in parallel and providing the same as a DC injection circuit. The motor terminal is interconnected to the AC source with the DC injection circuit. The switch is opened during a first half cycle of each complete alternation of the current supplied to the AC motor and closed during a second half cycle of each complete alternation of the current supplied to the AC motor so as to inject a DC voltage and current bias to the AC motor. The resistance of the stator winding is estimated in response to the DC voltage and current bias.

In a first embodiment, the DC voltage is measured between the motor terminal and a neutral point during a sample time period and is provided as the line-neutral voltage. The DC current injected to the AC motor is also measured during the sample time period and provided as the line current. The resistance of the stator winding is estimated according to the expression:

$$R_s = v_{as}/i_{as}$$

wherein $R_s$ is the estimated resistance of the stator winding; $v_{as}$ is the line-neutral voltage; and $i_{as}$ is the line current.

Alternatively, in a second embodiment, the DC voltage drop across the switch is measured during a sample time period and provided as the switch voltage. As such, the resistance of the stator winding may be estimated according to the expression:

$$R_s = (2*v_{sw})/(3*i_{as})$$

wherein $R_s$ is the estimated resistance of the stator winding; $v_{sw}$ is the switch voltage; and $i_{as}$ is the line current.

In a third embodiment, the AC motor may include a second motor terminal connected to the AC source by a line in order to provide voltage and current to the AC motor. The DC voltage drop between the first and second motor terminals is measured during a sample time period and provided as the line-line voltage. As such, the resistance of the stator winding may be estimated according to the expression:

$$R_s = (2*v_{ab})/(3*i_{as})$$

wherein $R_s$ is the estimated resistance of the stator winding; $v_{ab}$ is the line-line voltage; and $i_{as}$ is the line current.

It is contemplated that the resistor circuit include a resistor and the switch be either a MOSFET or an IGBT. The opening and closing of the switch occur at zero crossings of the current supplied to the AC motor by the AC source. The opening of the switch during the first half cycle of each complete alternation of the current supplied to the AC motor and the closing of the switch during the second half cycle of each complete alternation of the current supplied to the AC motor occur for predetermined time periods. It is contemplated that the first half cycle be the positive half cycle of each complete alternation of the current supplied to the AC motor and the second half cycle be the negative half cycle of each complete alternation of the current supplied to the AC motor.

In accordance with the further aspect of the present invention, a method is provided for estimating resistance of a stator winding of a three phase, AC motor. Each phase of the AC motor is connectable to an AC source for supplying voltage and current to the AC motor. The method includes the steps of providing a resistor circuit and a switch in parallel and providing the same as a DC injection circuit. A first phase of the AC motor is interconnected to the AC source by the DC injection circuit. A DC voltage and current bias is injected to the AC motor with the DC injection circuit. The resistance of the stator winding is estimated in response to the DC voltage and current bias.

The step of injecting the DC voltage and current bias to the AC motor includes the steps of opening the switch during the first half cycle of each complete alternation of the current supplied to the AC motor and closing the switch during the second half cycle of each complete alternation of the current supplied to the AC motor. The DC voltage and the current bias to the AC motor is injected for a predetermined period of time.

In a first embodiment, the DC voltage is measured between the first phase of the AC motor and a neutral point during a portion of the predetermined time period and is provided as the line-neutral voltage. The DC current injected to the first phase of the AC motor is also measured during the sample time period and provided as the line current. The resistance of the stator winding is estimated according to the expression:

$$R_s = v_{as}/i_{as}$$

wherein $R_s$ is the estimated resistance of the stator winding; $v_{as}$ is the line-neutral voltage; and $i_{as}$ is the line current.

Alternatively, in a second embodiment, the DC voltage drop across the switch is measured during a portion of the predetermined time period and provided as the switch voltage. As such, the resistance of the stator winding may be estimated according to the expression:

$$R_s = (2*v_{sw})/(3*i_{as})$$

wherein $R_s$ is the estimated resistance of the stator winding; $v_{sw}$ is the switch voltage; and $i_{as}$ is the line current.

In a third embodiment, the AC motor may include a second motor terminal connected to the AC source by a line for providing voltage and current to the AC motor. The DC voltage drop between a first and a second phase of the AC motor is measured during a portion of the predetermined time period and provided as a line voltage. As such, the resistance of the stator winding may be estimated according to the expression:

$$R_s = (2*v_{ab})/(3*i_{as})$$

wherein $R_s$ is the estimated resistance of the stator winding; $v_{ab}$ is the line-line voltage; and $i_{as}$ is the line current.

BRIEF DESCRIPTION OF THE DRAWINGS

The drawings furnished herewith illustrate a preferred construction of the present invention in which the above advantages and features are clearly disclosed as well as others which will be readily understood from the following description of the illustrated embodiment.

In the drawings.

DETAILED DESCRIPTION OF THE DRAWINGS

Figure 1:
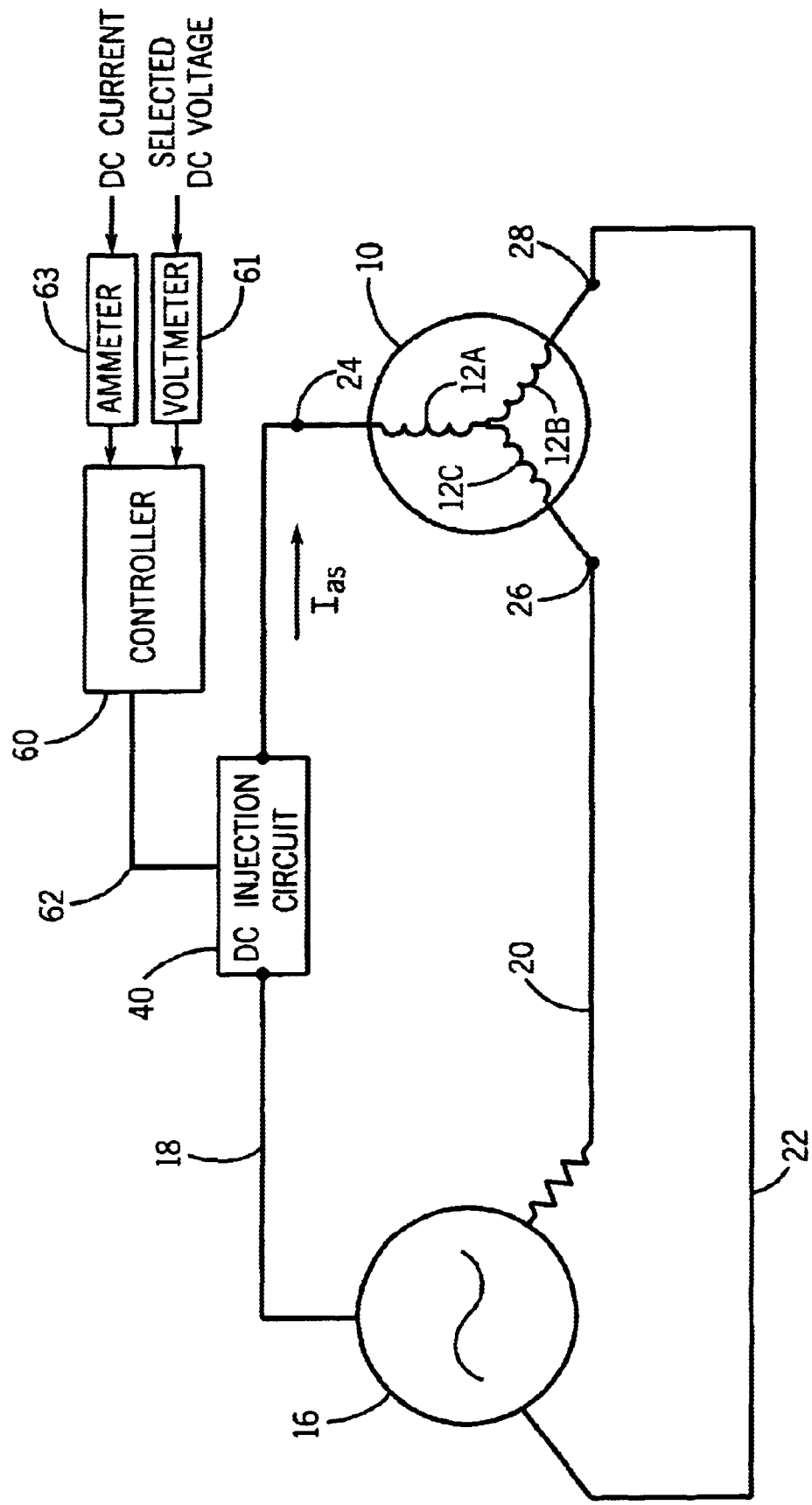
FIG. 1 is a schematic view of an AC induction motor system incorporating a DC injection circuit in accordance with the present invention.

Referring to FIG. 1, a three-phase, AC induction motor is generally designated by the reference numeral 10. As is conventional, AC induction motor 10 is represented as three windings 12a–12c connected in a wye arrangement. It can be appreciated that AC induction motor may be connected in a delta arrangement without deviating from the scope of the present invention. Stator windings 12a–12c of AC induction motor 10 are operatively connected to an AC source 16 through corresponding supply lines 18, 20 and 22, respectively, at motor terminals 24, 26 and 28, respectively.

In order to inject a DC voltage and current bias to AC induction motor 10, a DC injection circuit, generally designated by the reference numeral 40, is provided in one of supply lines 18, 20 or 22 which interconnects AC source 16 to AC induction motor 10. By way of example, DC injection circuit 40 is provided in supply line 18. However, it is contemplated that DC injection circuit 40 be alternatively provided in supply lines 20 or 22 without deviating from the scope of the present invention.

Figure 2:
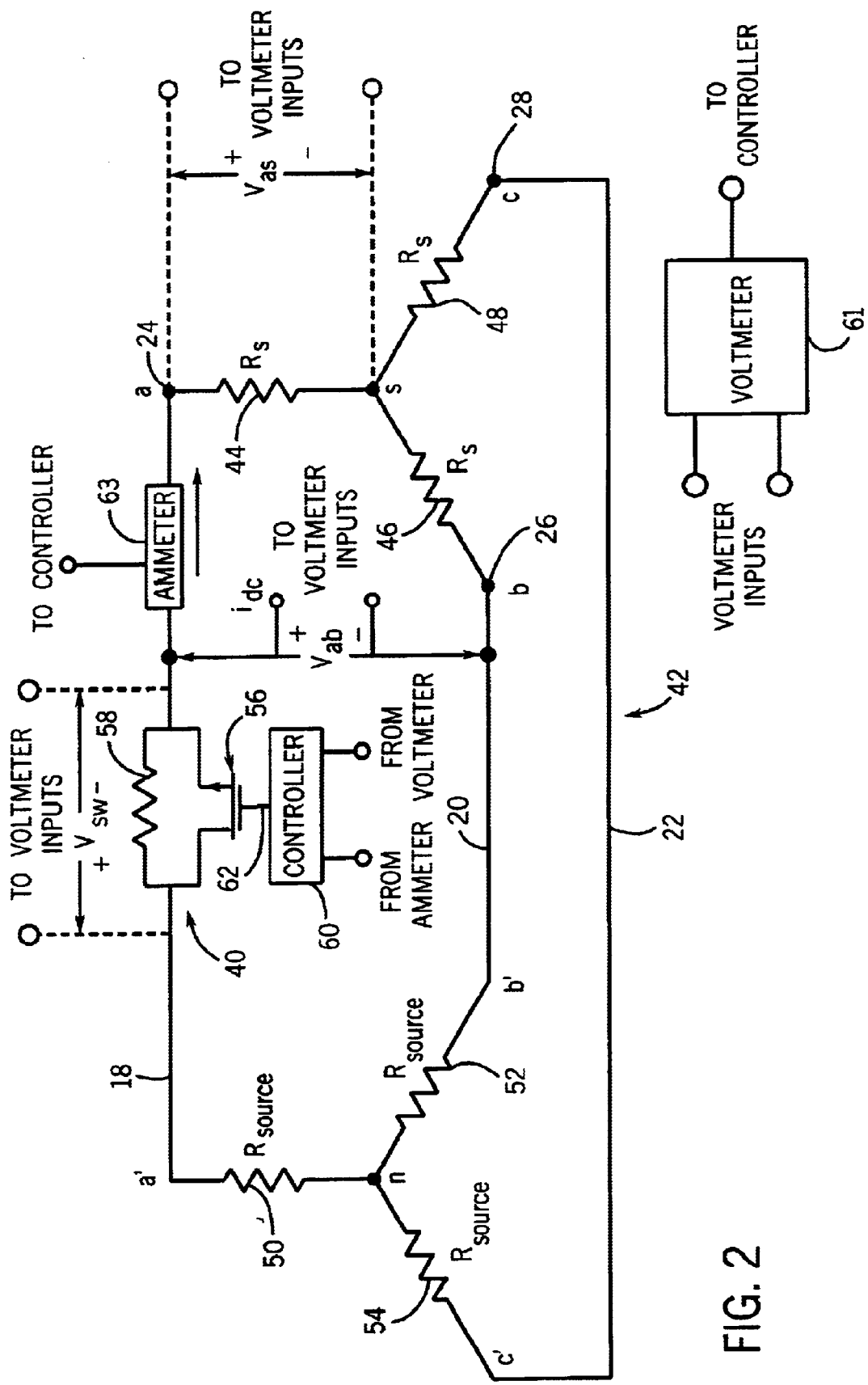
FIG. 2 is a schematic view of the DC equivalent circuit of the AC induction motor system of FIG. 1.

Referring to FIG. 2, the DC equivalent circuit of the circuit of FIG. 1 is generally designated by the reference numeral 42. The resistances $R_s$ of the stator windings 12a–12c of AC induction motor 10 are shown as resistors 44, 46 and 48 and the resistances $R_{source}$ of the AC source 16 in corresponding supply lines 18, 20 and 22 are shown as resistors 50, 52 and 54. DC injection circuit 40 is operatively connected to a controller 60 through line 62 in a manner hereinafter described. Controller 60 is operatively connected to a DC voltmeter 61 and a DC ammeter 63 for receiving various DC signals as hereinafter described.

DC injection circuit 40 includes a transistor 56 and a resistor 58 having a known resistance $R_{ext}$ connected in parallel. In a preferred embodiment, transistor 56 is an n-channel enhancement type, power metal oxide-semiconductor field-effect transistor (MOSFET). However, it is contemplated that transistor 56 may be an insulated gate bipolar transistor (IGBT) without deviating from the scope of the present invention. The drain of the transistor 56 is operatively connected to AC source 16 and the source of transistor 56 is operatively connected to motor terminal 24 of AC induction motor 10. As is known, the flow of electrons from the source of transistor 56 to the drain of transistor 56 is controlled by the voltage applied to the gate. In other words, the on/off state of transistor 56 is controlled by the voltage applied to the gate. As such, the gate of the transistor 56 is operatively connected to controller 60 which, in turn, controls the opening and closing of transistor 56 for reasons hereinafter described.

In accordance with the method of the present invention, the DC injection circuit of the present invention as two modes of operation: a DC injection mode and a normal mode. In the DC injection mode, DC injection circuit 40 injects a DC voltage and current bias on supply line 18 to AC induction motor 10 for estimation of the stator winding resistance $R_s$. During the normal mode, a DC voltage and current bias is not injected on supply line 18 to the AC induction motor 10.

In the normal mode, controller 60 provides a voltage to the gate of transistor 56 so as to turn transistor 56 on. With transistor 56 on, the resistance $R_{ds}$ across transistor 56 is in parallel with the resistance $R_{ext}$ across resistor 58. It is noted that the resistance $R_{ds}$ across transistor 56 is minimal. As such, the resistance across DC injection circuit 40 is negligibly small, and hence, the power dissipated by the transistor 56 during operation of the DC injection circuit 40 in the normal mode is very low. For reasons hereinafter described, in the DC injection mode, transistor 56 is turned off when the AC current $I_{as}$ conducting through the DC injection circuit 40 is positive such that the transistor 56 acts like an open circuit.

Figure 3:
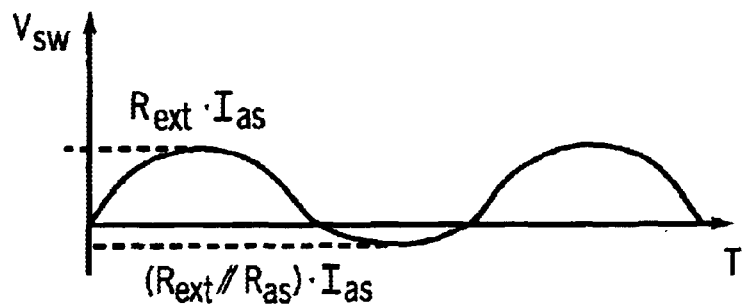
FIG. 3 is a diagram of a waveform showing the voltage drop across the DC injection circuit of the present invention over time.

During start up, controller 60 turns transistor 56 on as heretofore described. The AC current $I_{as}$ on the supply line 18 conducts through transistor 56 thereby minimizing the power dissipated by the DC injection circuit 40 during the initial negative half cycle of the AC current $I_{as}$ supplied to AC induction motor 10. During the positive half cycle of the AC current $I_{as}$, transistor 56 is turned off by controller 60 such that the AC current $I_{as}$ conducts through resistor 58. Since the resistance $R_{ext}$ of resistor 58 is greater than the resistance $R_{ds}$ across transistor 56, the DC voltage drop across DC injection circuit 40 is proportionally greater when transistor 56 is off. As best seen in FIG. 3, as the process is repeated over time, an asymmetrical AC voltage drop $v_{sw}$ occurs across the DC injection circuit 40 which, in turn, injects a DC voltage and current bias to the AC induction motor 10. In order to minimize switching losses, the transistor 56 is turned on and off by controller 60 at the zero crossings of the AC current $I_{as}$ at a switching frequency less than 50 Hertz.

In order to estimate the resistance $R_s$ of stator windings 12a–12c, one of the following DC voltage drops must be measured in any suitable manner, such as by voltmeter 61:

1) the DC voltage drop $v_{sw}$ across DC injection circuit 40;
2) the DC voltage drop $v_{ab}$ between motor terminals 24 and 26; or
3) the DC voltage drop $v_{as}$ between motor terminal 24 and a neutral point in AC induction motor 10.

For reasons hereinafter described, the measured voltage drop is provided as an input to controller 60. In addition, ammeter 63 is provided in supply line 18 between DC injection circuit 40 and motor terminal 24 of AC induction motor 10 to measure the DC component $i_{dc}$ of the phase current $I_{as}$. Similarly, for reasons hereinafter described, the measured DC current $I_{dc}$ is provided as an input to controller 60.

Controller 60 includes a microprocessor programmed to calculate the estimated resistance $R_s$ of stator windings 12a–12c. In a first embodiment, if voltmeter 61 is used to measure the DC voltage drop $v_{as}$ is measured between motor terminal 24 and a neutral point in AC induction motor 10, the resistance of $R_s$ of stator windings 12a–12c is estimated according to the expression:

$$R_s = v_{as}/i_{dc}$$

wherein $R_s$ is the estimated resistance of the stator winding; $v_{as}$ is the line-neutral voltage; and $i_{dc}$ is the DC line current uncovered by ammeter 63.

Alternatively, in a second embodiment, if voltmeter 61 is used to measure the DC voltage drop $v_{sw}$ across the DC injection circuit 40, the resistance $R_s$ of stator windings 12a–12c is estimated according to the expression:

$$R_s = (2*v_{sw})/(3*i_{dc})$$

wherein $R_s$ is the estimated resistance of the stator winding $v_{sw}$ is the voltage drop across the DC injection voltage; and $i_{dc}$ is the line current measured by ammeter 63.

In the third embodiment, if voltmeter 61 is used to measure the DC voltage drop $v_{ab}$ between motor terminals 24 and 26, the resistance of stator windings 12a–12c is estimated according to the expression:

$$R_s = (2*v_{ab})/(3*i_{dc})$$

wherein $R_s$ is the estimated resistance of the stator winding; $v_{ab}$ is the line-line voltage; and $i_{dc}$ is the DC line current measured by the ammeter 63.

It may be appreciated that it is easier to measure the DC voltage drop $v_{sw}$ across DC injection circuit 40 than to measure the line-line or line-neutral voltages $v_{ab}$ and $v_{as}$, respectively, since the superimposed AC component is much larger when using the motor terminal voltages. Since voltage drop $v_{sw}$ across DC injection circuit 40 is much smaller as compared to the motor terminal voltages, the resolution of the measurement of the voltage drop $v_{sw}$ across DC injection circuit 40, as well as, the accuracy of such measurement is high. However, it is understood that for purposes of estimating the resistance $R_s$ of stator windings 12a–12c, the source resistance $R_{source}$ and the cable resistance have been ignored. For small motors, it can be assumed that the resistance and temperature variation of the source and the cable is negligible as compared to the resistance and temperature variation of stator windings 12a–12c of AC induction motor 10.

Figure 4:
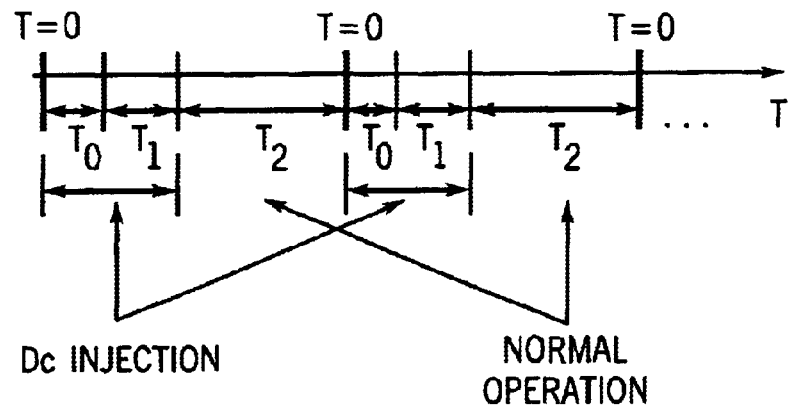
FIG. 4 is a timing diagram showing operation of the DC injection circuit of the present invention.

Referring to FIG. 4, a proposed timing diagram showing operation of the DC injection circuit 40 is provided. As heretofore described, for each period of DC injection, there are two modes of operation: the DC injection mode and the normal mode. It is contemplated to provide first and second time intervals $T_0$ and $T_1$, respectively, in the DC injection mode. Since there is a short transient immediately after DC injection, the integration for obtaining the DC components of the voltage and current is delayed by the first time interval $T_0$. The DC voltage and current components generated by DC injection circuit 40 are measured by voltmeter 61 and ammeter 63 and provided to controller 60, as heretofore described, during second time interval $T_1$ to avoid the DC transient. DC injection circuit 40 is operated in normal mode during time period $T_2$ between the DC injection periods $T_1$ and $T_2$ to minimize the power loss in DC injection circuit.

Upon completion of the DC injection mode $T_0$ and $T_1$, the microprocessor of controller 60 calculates the estimated resistance $R_s$ of the stator windings 12a–12c as heretofore described. As is known, based upon the resistance $R_s$ of the stator windings 12a–12c, the temperature of AC induction motor 10 may be determined.

Various modes of carrying out the invention are contemplated as being within the scope of the following claims particularly pointing out and distinctly claiming the subject matter which is regarded as the invention.

We claim:

1. A device to estimate resistance of a stator winding of an AC motor, the AC motor having a motor terminal connectable to an AC source for providing voltage and current to the AC motor, comprising:
    a circuit having a first input node connectable to the AC source and the output node connectable to the motor terminal, the circuit including:
        a resistor;
        a switch connected in parallel with the resistor circuit, the switch movable between a first open position and a second closed position;
    a voltmeter for measuring the DC voltage drop across the circuit;
    an ammeter for measuring the DC current supplied to the motor terminal; and
    a digital signal processor operatively connected to the switch, the voltmeter and the ammeter, the digital signal processor controlling the movement of the switch between the open and closed positions so as to inject a DC voltage and current bias to the AC motor and estimating the resistance of the stator winding in response to the DC voltage and current bias.

2. The device of claim 1 wherein the switch is a metal-oxide-semi-conductor field-effect transistor (MOSFET).

3. The device of claim 1 wherein the switch is an insulated gate bipolar transistor (IGBT).

4. A method of estimating resistance of a stator winding of an AC motor, the AC motor having a motor terminal connectable to an AC source for supplying voltage and current to the AC motor, comprising the steps of:
    connecting a resistor circuit and a switch in parallel and providing the same as a DC injection circuit;
    interconnecting the motor terminal to the AC source with the DC injection circuit;
    opening the switch during a first half-cycle of each complete alternation of the current supplied to the AC motor and closing the switch during a second half-cycle of each complete alternation of the current supplied to the AC motor for a predetermined time period so as to inject a DC voltage and current bias to the AC motor; and
    estimating the resistance of the stator winding in response to the DC voltage and current bias.

5. The method of claim 4 comprising the additional steps of:
    measuring a DC voltage between the motor terminal and a neutral point during a sample time period and providing the same as the line-neutral voltage; and
    measuring the DC current injected to the AC motor during the sample time period and providing the same as the line current.

6. The method of claim 5 wherein the resistance of the stator winding is estimated according to the expression:

$$R_s = v_{as}/i_{as}$$

wherein $R_s$ is the estimated resistance of the stator winding;
$v_{as}$ is the line-neutral voltage; and
$i_{as}$ is the line current.

7. The method of claim 4 comprising the additional steps of:
    measuring a DC voltage drop across the switch during a sample time period and providing the same as a switch voltage; and
    measuring the DC current injected to the AC motor during the sample time period and providing the same as a line current.

8. The method of claim 7 wherein the resistance of the stator winding is estimated according to the expression:

$$R_s = (2 * v_{sw})/(3 * i_{as})$$

wherein $R_s$ is the estimated resistance of the stator winding;
$v_{sw}$ is the switch voltage; and
$i_{as}$ is the line current.

9. The method of claim 4 wherein the AC motor includes a second motor terminal connected to the AC source by a line for providing voltage and current to the AC motor, the method comprising the additional steps of:
    measuring a DC voltage drop between the first and second motor terminal during a sample time period and providing the same as a line-line voltage; and
    measuring the DC current injected to the AC motor during the sample time period and providing the same as a line current.

10. The method of claim 9 wherein the resistance of the stator winding is estimated according to the expression:

$$R_s = (2 * v_{ab})/(3 * i_{as})$$

wherein $R_s$ is the estimated resistance of the stator winding;

$v_{ab}$ is the line-line voltage; and $i_{as}$ is the line current.

11. The method of claim 4 wherein the resistor circuit includes a resistor.

12. The method of claim 4 wherein the switch is a metal-oxide-semi-conductor field-effect transistor (MOSFET).

13. The method of claim 4 wherein the switch is an insulated gate bipolar transistor (IGBT).

14. The method of claim 4 wherein the opening and the closing of the switch occur at zero-crossing of the current supplied to the AC motor by the AC source.

15. A method of estimating resistance of a stator winding of a three phase, AC motor, each phase of the AC motor connectable to an AC source for supplying voltage and current to the AC motor, comprising the steps of:

providing a resistor and a switch in parallel and providing the same as a DC injection circuit;

interconnecting a first phase of the AC motor to the AC source with the DC injection circuit;

injecting a DC voltage and current bias to the AC motor with the DC injection circuit for a predetermined time period; and estimating the resistance of the stator winding in response to the DC voltage and current bias.

16. The method of claim 15, comprising the additional steps of:

measuring the DC voltage between the first phase of the AC motor and a neutral point during a portion of the predetermined time period and providing the same as the line-neutral voltage; and measuring the DC current injected to the first phase of the AC motor during the portion of the predetermined time period and providing the same as the line current.

17. The method of claim 16, wherein the resistance of the stator winding is estimated according to the expression:

$$R_s = v_{as}/i_{as}$$

wherein $R_s$ is the estimated resistance of the stator winding;

$v_{as}$ is the line-neutral voltage; and $i_{as}$ is the line current.

18. The method of claim 15, comprising the additional steps of:

measuring a DC voltage drop across the switch during a portion of the predetermined time period and providing the same as a switch voltage; and measuring the DC current injected to the AC motor during the portion of the predetermined time period and providing the same as a line current.

19. The method of claim 18 wherein the resistance of the stator winding is estimated according to the expression:

$$R_s = (2*v_{sw})/(3*i_{as})$$

wherein $R_s$ is the estimated resistance of the stator winding;

$v_{sw}$ is the switch voltage; and $i_{as}$ is the line current.

20. The method of claim 15, wherein the AC motor includes a second motor terminal connected to the AC source by a line for providing voltage and current to the AC motor, the method comprising the additional steps of:

measuring a DC voltage drop between a first and a second phase of the AC motor during portion of the predetermined time period and providing the same as a line-line voltage; and measuring the DC current injected to the AC motor during the portion of the predetermined time period and providing the same as a line current.

21. The method of claim 20, wherein the resistance of the stator winding is estimated according to the expression:

$$R_s = (2*v_{ab})/(3*i_{as})$$

wherein $R_s$ is the estimated resistance of the stator winding;

$v_{ab}$ is the line-line voltage; and $i_{as}$ is the line current.

22. A method of estimating resistance of a stator winding of a three phase, AC motor, each phase of the AC motor connectable to an AC source for supplying voltage and current to the AC motor, comprising the steps of:

providing a resistor circuit and a switch in parallel and providing the same as a DC injection circuit;

interconnecting a first phase of the AC motor to the AC source with the DC injection circuit;

injecting a DC voltage and current bias to the AC motor with the DC injection circuit by performing the steps of:

opening the switch during a first half-cycle of each complete alternation of the current supplied to the AC motor; and closing the switch during a second half-cycle of each complete alternation of the current supplied to the AC motor; and estimating the resistance of the stator winding in response to the DC voltage and current bias.

23. A method of estimating resistance of a stator winding of an AC motor, each phase of the AC motor connectable to an AC source for supplying voltage and current to the AC motor, comprising the steps of:

connecting a resistor circuit and a switch in parallel and providing the same as a DC injection circuit;

interconnecting the motor terminal to the AC source with the DC injection circuit;

opening the switch during a positive half-cycle of each complete alternation of the current supplied to the AC motor and closing the switch during a negative half-cycle of each complete alternation of the current supplied to the AC motor so as to inject a DC voltage and current bias to the AC motor; and estimating the resistance of the stator winding in response to the DC voltage and current bias.

* * * * *